(12) United States Patent
Lin et al.

(10) Patent No.: US 10,951,182 B1
(45) Date of Patent: Mar. 16, 2021

(54) MILLIMETER WAVE POWER AMPLIFIER CIRCUIT AND MILLIMETER WAVE POWER AMPLIFIER DEVICE

(71) Applicant: KEYCORE TECHNOLOGY CORP., Zhubei (TW)

(72) Inventors: Wei-Cheng Lin, Zhubei (TW); Shih-Hsiu Tseng, Zhubei (TW); Chien-Jen Hsiao, Zhubei (TW); Chung-Hsin Liu, Zhubei (TW)

(73) Assignee: Keycore Technology Corp., Zhubei (TW)

( * ) Notice: Subject to any disclaimer, the term of this patent is extended or adjusted under 35 U.S.C. 154(b) by 0 days.

(21) Appl. No.: 16/732,368

(22) Filed: Jan. 2, 2020

(51) Int. Cl.
*H03F 3/191* (2006.01)
*H03F 3/21* (2006.01)

(52) U.S. Cl.
CPC ......... *H03F 3/21* (2013.01); *H03F 2200/451* (2013.01)

(58) Field of Classification Search
CPC ....................................................... H03F 3/191
USPC .................................................. 330/302, 303
See application file for complete search history.

(56) References Cited

U.S. PATENT DOCUMENTS 7,636,021 B2 * 12/2009 Rohde .................. H03B 5/1841
331/117 FE

* cited by examiner

*Primary Examiner* — Henry Choe
(74) *Attorney, Agent, or Firm* — Thomas J. Nikolai; DeWitt LLP

(57) ABSTRACT

A millimeter wave power amplifier device has multiple millimeter wave power amplifier circuits. Each millimeter wave power amplifier circuit includes a transistor, a first serial connection resonation unit, a second serial connection resonation unit, multiple first frequency band adjustment units and multiple second frequency band adjustment units. The transistor has a first end connected with an input end, a second end connected with a grounding end and a third end connected with an output end. Each of the first and second frequency band adjustment units has a switch member and two storage members. The switch member and the storage members of the first and second frequency band adjustment units are serially connected. The millimeter wave power amplifier device can achieve multi-frequency band adjustable effect to lower the cost.

20 Claims, 6 Drawing Sheets

MILLIMETER WAVE POWER AMPLIFIER CIRCUIT AND MILLIMETER WAVE POWER AMPLIFIER DEVICE

BACKGROUND OF THE INVENTION

1. Field of the Invention

The present invention relates generally to a millimeter wave power amplifier circuit and a millimeter wave power amplifier device, and more particularly to a millimeter wave power amplifier circuit and a millimeter wave power amplifier device, which can achieve multi-frequency band adjustable effect.

2. Description of the Related Art

Various devices using millimeter-wave signal have been developed. There are many semiconductor devices employing millimeter wave, including the device operated on the basis of electromagnetic spectrum within the range of radio wave frequency band (between about 30 GHz and about 300 GHz). The millimeter wave device has the wavelength ranging from 1 mm to about 10 mm corresponding to the radio frequency from 30 GHz to about 300 GHz. This frequency band is sometimes termed extremely high frequency (EHF) frequency band range. Laser devices, communication devices, etc. are examples of the devices employing millimeter wave, wherein the laser devices have been applied to various fields such as vehicle security.

In the design of multi-frequency band millimeter wave power amplifier of the conventional laser device (such as vehicle laser anti-collision system), generally one single variable capacitor is used for selecting various frequencies. However, in practice, such design has very great error in frequency adjustment and it is uneasy to adjust the frequency. Moreover, the more the covered frequencies are, the more expensive the selected capacitor is. In another manner, multiple millimeter wave power amplifier circuits with different frequency bands are assembled to form a multi-frequency band millimeter wave power amplifier. For example, three millimeter wave power amplifier circuits with three frequency bands of 24G, 60G and 70G are integrated on the same circuit board. In addition, the three millimeter wave power amplifier circuits with three frequency bands on the same circuit board are respectively independently connected with a transmission antenna without electrical connection therebetween. As a result, the entire circuit structure is complicated. Also, the millimeter wave power amplifier must include more frequency bands (such as 24G, 60G, 70G, 80G and 120G) so that the total volume of the circuit will become larger (including the circuit board and the electronic components). As a result, the cost is increased and the adjustable frequency band is fixed.

SUMMARY OF THE INVENTION

It is therefore a primary object of the present invention to provide a millimeter wave power amplifier circuit, which can achieve multi-frequency band adjustable effect to lower the cost.

It is a further object of the present invention to provide a millimeter wave power amplifier device, which can achieve multi-frequency band set adjustable effect to lower the cost.

It is still a further object of the present invention to provide a millimeter wave power amplifier circuit, which can simplify the design of the circuit and increase design elasticity.

It is still a further object of the present invention to provide a millimeter wave power amplifier device, which can simplify the design of the circuit and increase design elasticity.

It is still a further object of the present invention to provide a millimeter wave power amplifier circuit, in which by means of multiple first and second frequency band adjustment units, a user himself/herself can adjust and select the desired working frequency bands. Therefore, the operation is facilitated and the usage of the circuit can be elastically adjusted.

It is still a further object of the present invention to provide a millimeter wave power amplifier device, in which by means of multiple first and second frequency band adjustment units, a user himself/herself can adjust and select the desired working frequency bands. Therefore, the operation is facilitated and the usage of the circuit can be elastically adjusted.

To achieve the above and other objects, the millimeter wave power amplifier circuit of the present invention includes a transistor, a first serial connection resonation unit, a second serial connection resonation unit, multiple first frequency band adjustment units and multiple second frequency band adjustment units. The transistor has a first end, a second end and a third end. The first end is connected with an input end. The second end is connected with a grounding end. The third end is respectively connected with an input power supply and an output end. The first serial connection resonation unit is connected between the first end and the input end. The second serial is connection resonation unit connected between the third end and the output end. The multiple first frequency band adjustment units have a first switch member, a first storage member and a second storage member. One end of the first switch member is connected with the first end. The other end of the first switch member is serially connected with the first and second storage members. The second storage member is connected with the grounding end. The multiple second frequency band adjustment units have a second switch member, a third storage member and a fourth storage member. One end of the second switch member is connected with the third end. The other end of the second switch member is serially connected with the third and fourth storage members. The fourth storage member is connected with the grounding end.

Still to achieve the above and other objects, the millimeter wave power amplifier device of the present invention includes multiple millimeter wave power amplifier circuits. The multiple millimeter wave power amplifier circuits have an input end and an output end. The output end of a front millimeter wave power amplifier circuit in each two adjacent millimeter wave power amplifier circuits is connected with the input end of a rear millimeter wave power amplifier circuit in each two adjacent millimeter wave power amplifier circuits. Each millimeter wave power amplifier circuit includes a transistor, a first serial connection resonation unit, a second serial connection resonation unit, multiple first frequency band adjustment units and multiple second frequency band adjustment units. The transistor has a first end, a second end and a third end. The first end is connected with an input end. The second end is connected with a grounding end. The third end is respectively connected with an input power supply and an output end. The first serial connection resonation unit is connected between the first end and the input end. The second serial is connection resonation unit connected between the third end and the output end. The multiple first frequency band adjustment units have a first switch member, a first storage member and a second storage member. One end of the first switch member is connected with the first end. The other end of the first switch member is serially connected with the first and second storage members. The second storage member is connected with the grounding end. The multiple second frequency band adjustment units have a second switch member, a third storage member and a fourth storage member. One end of the second switch member is connected with the third end. The other end of the second switch member is serially connected with the third and fourth storage members. The fourth storage member is connected with the grounding end.

Therefore, the millimeter wave power amplifier circuit of the present invention can achieve multi-frequency band (multi-frequency) adjustable effect to lower the cost. Also, the design of the circuit is simplified and the circuit can be designed more elastically.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
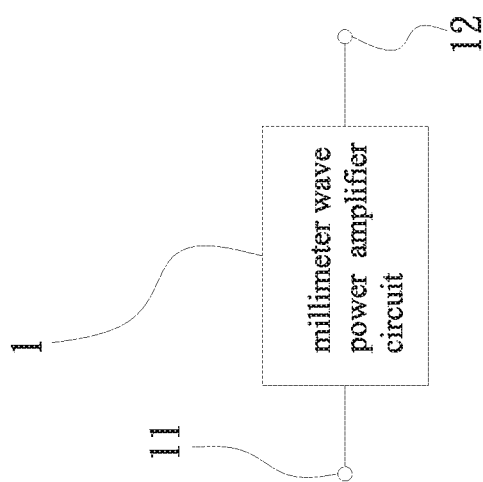
FIG. 1 is a block diagram of a first embodiment of the present invention.
Figure 2:
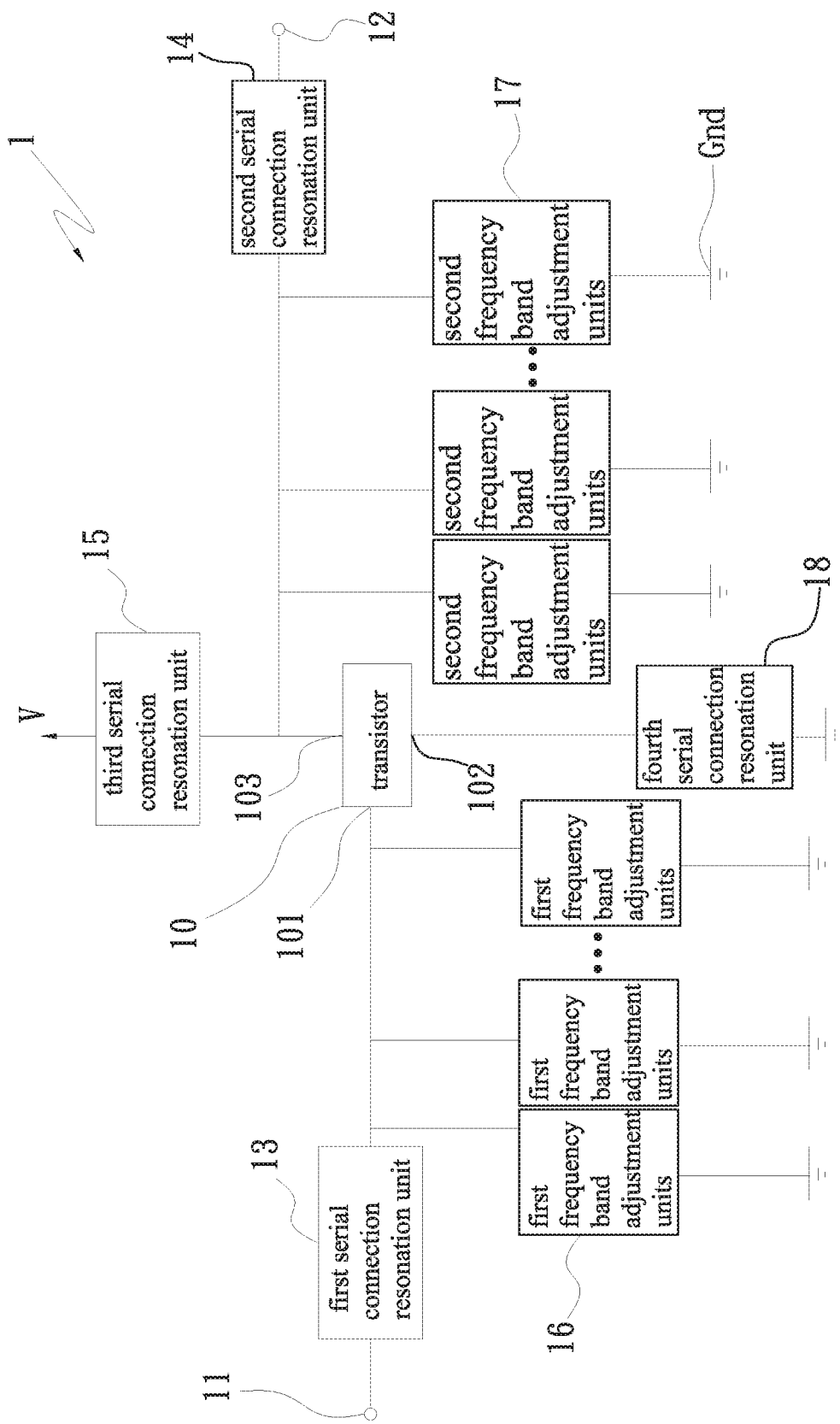
FIG. 2 is another block diagram of the first embodiment of the present invention.
Figure 3:
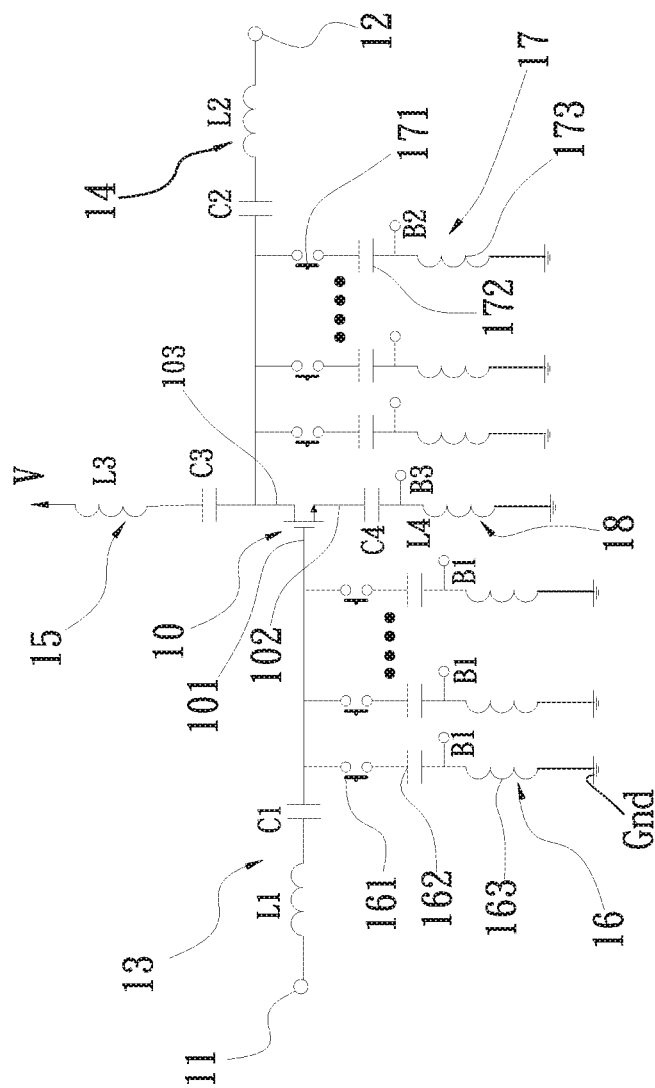
FIG. 3 is a circuit diagram of the first embodiment of the present invention.
Figure 4:
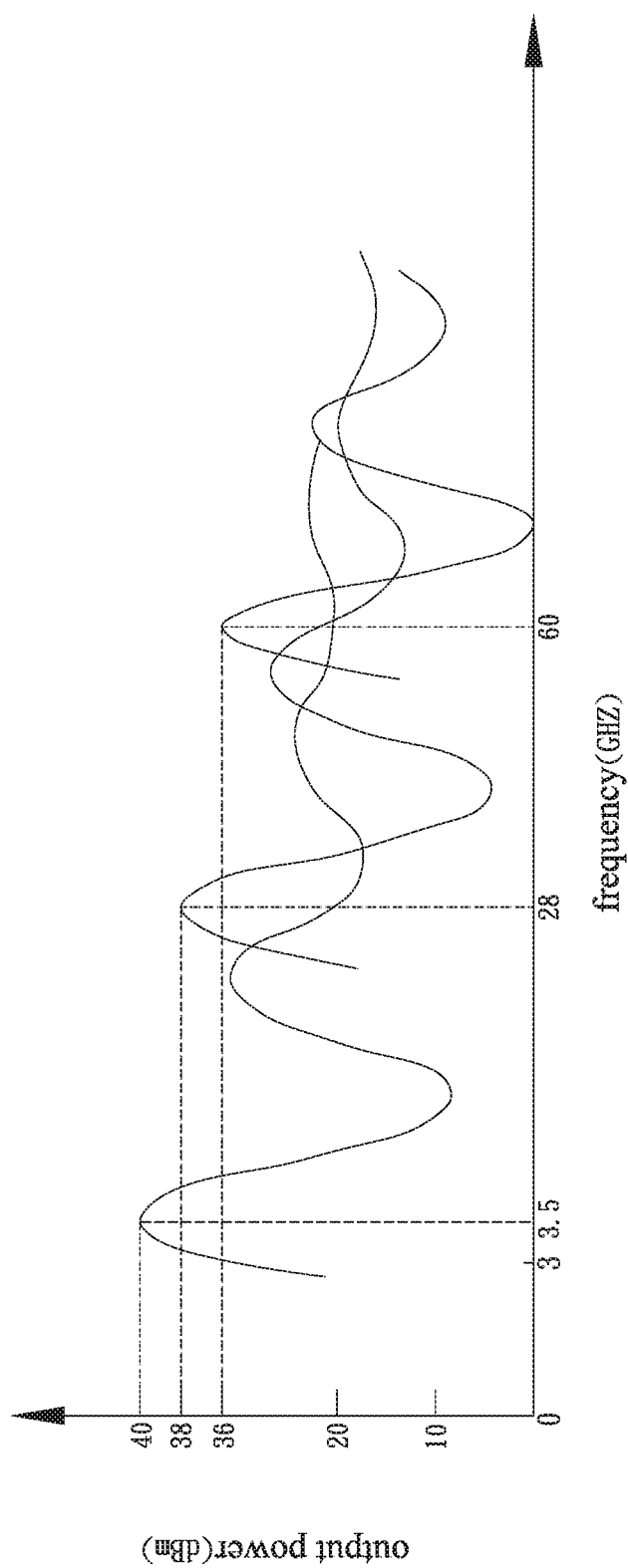
FIG. 4 is an output power vs. frequency measurement diagram of the millimeter wave power amplifier circuit of the present invention.

The present invention provides a millimeter wave power amplifier circuit and a millimeter wave power amplifier device. Please refer to FIGS. 1 to 4. FIG. 1 is a block diagram of a first embodiment of the present invention. FIG. 2 is another block diagram of the first embodiment of the present invention. FIG. 3 is a circuit diagram of the first embodiment of the present invention. FIG. 4 is an output power vs. frequency measurement diagram of the millimeter wave power amplifier circuit of the present invention. As shown in the drawings, the millimeter wave power amplifier circuit 1 is applied to a millimeter wave system (not shown), for example, tire pressure detection system, vehicle radar detection system, vehicle anti-collision radar system, wireless communication system (such as 5G system), medical scanning system or the like. The millimeter wave power amplifier circuit 1 includes a transistor 10, a first serial connection resonation unit 13, a second serial connection resonation unit 14, multiple first frequency band adjustment units 16, multiple second frequency band adjustment units 17, an input end 11 and an output end 12. In this embodiment, the transistor 10 is, but not limited to, a field-effect transistor (FET) such as an n-type metal-oxide-semiconductor field-effect transistor (NMOS). In practice, the transistor 10 of the present invention can be any semiconductor component with amplification function. The input end 11 serves to receive a radio-frequency signal (or wireless signal) transmitted from a processor (such as CPU, MCU or DSP) or single chip (such as radio-frequency chip or RF) in a millimeter wave system. The output end 12 serves to output the amplified radio-frequency signal. For example, the output end 12 of the millimeter wave power amplifier circuit 1 outputs and transmits the amplified radio-frequency signal via an antenna (such as multi-frequency antenna).

The transistor 10 has a first end 101, a second end 102 and a third end 103. In this embodiment, the first, second and third ends 101, 102, 103 are sequentially a gate, a source and a drain. The first end 101 (the gate) is electrically connected with the input end 11. The second end 102 (the source) is electrically connected with a grounding end Gnd. The third end 103 is electrically connected with an input power supply V (such as 5 volts (V) or 12 volts (V)) and the output end 12. The first serial connection resonation unit 13 is electrically connected between the first end 101 and the input end 11. The first serial connection resonation unit 13 only permits the signal of a specific frequency band to pass through and prevents any other signal out of the frequency band from passing through. The first serial connection resonation unit 13 has a first inductor L1 and a first capacitor C1. Two ends of the first inductor L1 are respectively electrically connected with the input end 11 and one end of the first capacitor C1. The other end of the first capacitor C1 is connected with the gate (the first end 101) of the transistor 10. The second serial connection resonation unit 14 is electrically connected between the third end 103 and the output end 12. The second serial connection resonation unit 14 has a second inductor L2 and a second capacitor C2. Two ends of the second inductor L2 are respectively electrically connected with the output end 12 and one end of the second capacitor C2. The other end of the second capacitor C2 is connected with the drain of the transistor 10. In a preferred embodiment, the transistor 10 is selected from a group consisting of complementary metal-oxide-semiconductor (CMOS), SiGe transistor, GaAs transistor, GaN transistor and bipolar junction transistor (BJT).

The millimeter wave power amplifier circuit 1 further includes a third serial connection resonation unit 15 and a fourth serial connection resonation unit 18. The third serial connection resonation unit 15 is connected between the third end 103 and the input power supply V. The third serial connection resonation unit 15 has a third inductor L3 and a third capacitor C3. Two ends of the third inductor L3 are respectively electrically connected with the input power supply V and one end of the third capacitor C3. The other end of the third capacitor C3 is electrically connected with the drain (the third end 103) of the transistor 10 and the other end of the second capacitor C2. The fourth serial connection resonation unit 18 is connected between the second end 102 and the grounding end Gnd. The fourth serial connection resonation unit 18 has a fourth inductor L4 and a fourth capacitor C4. Two ends of the fourth inductor L4 are respectively electrically connected with the source (the second end 102) and one end of the fourth inductor L4. The other end of the fourth inductor L4 is connected with the grounding end Gnd. A third input bias B3 (such as 5 volts or 12 volts) is connected between the fourth capacitor C4 and the fourth inductor L4. In a modified embodiment, the third and fourth serial connection resonation units 15, 18 can be omitted.

In this embodiment, the multiple first frequency band adjustment units 16 are such as eleven first frequency band adjustment units 16, which are connected with each other in parallel between the gate of the transistor 10 and the first serial connection resonation unit 13. The multiple first frequency band adjustment units 16 have a first switch member 161, a first storage member 162 and a second storage member 163. In this embodiment, the first and second storage members 162, 163 respectively are such as a capacitor and an inductor. In this embodiment, the first switch 161 is a pushbutton switch. One end of the first switch member 161 is connected with the first end 101. The other end of the first switch member 161 is serially connected with the first and second storage members 162, 163. That is, two ends of the first storage member 162 are respectively electrically connected with the other end of the first switch member 161 and one end of the second storage member 163. The other end of the second storage member 163 is electrically connected with the grounding end Gnd. In addition, a first input bias B1 (such as 5 volts or 12 volts) is connected between the first storage member 162 and the second storage member 163.

In this embodiment, the multiple second frequency band adjustment units 17 are such as nine second frequency band adjustment units 17, which are connected with each other in parallel between the drain of the transistor 10 and the second serial connection resonation unit 14. The multiple second frequency band adjustment units 17 have a second switch member 171, a third storage member 172 and a fourth storage member 173. In this embodiment, the third and fourth storage members 172, 173 respectively are such as a capacitor and an inductor. In this embodiment, the second switch 171 is a pushbutton switch. One end of the second switch member 171 is electrically connected with the third end 103. The other end of the second switch member 171 is serially connected with the third and fourth storage members 172, 173. That is, two ends of the third storage member 172 are respectively electrically connected with the other end of the second switch member 171 and one end of the fourth storage member 173. The other end of the fourth storage member 173 is electrically connected with the grounding end Gnd. In addition, a second input bias B2 (such as 5 volts or 12 volts) is connected between the third storage member 172 and the fourth storage member 173. In this embodiment, the voltages of the first, second and third input biases B1, B2, B3 are the same. In a preferred embodiment, the first and second storage members 162, 172 can be respectively inductors and the second and fourth storage members 163, 173 are capacitors. The first and second switch members 161, 171 are finger-shifted switches, touch switches or any other switch members, which can be switched on or off.

Moreover, the numbers of the multiple first and second frequency band adjustment units 16, 17 are not limited. The numbers of the multiple first and second frequency band adjustment units 16, 17 mentioned in the above embodiment are only for easy illustration. In practice, the numbers of the multiple first and second frequency band adjustment units 16, 17 can be adjusted according to the design of the necessary multi-frequency band and frequency range. In addition, the number of the first frequency band adjustment units 16 can be equal to or unequal to the number of the second frequency band adjustment units 17. For example, the numbers of the multiple first and second frequency band adjustment units 16, 17 are both eleven. Alternatively, the number of the first frequency band adjustment units 16 is such as five and the number of the second frequency band adjustment units 17 is such as sixteen.

Therefore, when it is desired to adjust (or switch) the central frequency of the amplified radio-frequency signal output from the millimeter wave power amplifier circuit 1 into such as 3.5 GHz, a user only needs to press and switch on such as the first switch member 161 of the first and third ones of the first frequency band adjustment units 16 and such as the second switch member 171 of the second and seventh ones of the second frequency band adjustment units 17. Therefore, the corresponding pressed first and second switch members 161, 171 are switched on, while the first and second switch members 161, 171 of the rest first and second frequency band adjustment units 16, 17 are switched off, whereby the central frequency of the amplified radio-frequency signal output from the output end 12 is adjusted into such as 3.5 GHz. When it is desired to adjust the central frequency of the amplified radio-frequency signal output from the millimeter wave power amplifier circuit 1 into such as 28 GHz, a user only needs to press and switch on such as the first switch member 161 of the sixth and eleventh ones of the first frequency band adjustment units 16 and such as the second switch member 171 of the third and ninth ones of the second frequency band adjustment units 17. Therefore, the corresponding pressed first and second switch members 161, 171 are switched on, while the first and second switch members 161, 171 of the rest first and second frequency band adjustment units 16, 17 are switched off, whereby the central frequency of the amplified radio-frequency signal output from the output end 12 is adjusted into such as 28 GHz.

When it is desired to adjust the central frequency of the amplified radio-frequency signal output from the millimeter wave power amplifier circuit 1 into such as 60 GHz, a user only needs to press such as the first switch member 161 of the fifth and tenth ones of the first frequency band adjustment units 16 and such as the second switch member 171 of the fourth and seventh ones of the second frequency band adjustment units 17.

Therefore, the corresponding pressed first and second switch members 161, 171 are switched on, while the first and second switch members 161, 171 of the rest first and second frequency band adjustment units 16, 17 are switched off, whereby the central frequency of the amplified radio-frequency signal output from the output end 12 is adjusted into such as 60 GHz. FIG. 4 is an output power vs. frequency measurement diagram of the millimeter wave power amplifier circuit 1 of the present invention. In FIG. 4, the longitudinal axis is output power (dBm), while the transverse axis is frequency (GHz).

Therefore, some first switch members 161 in the multiple first frequency band adjustment units 16 can be adjusted and switched on and some second switch members 171 in the multiple second frequency band adjustment units 17 can be cooperatively adjusted and switched on, whereby a user himself/herself can adjust and select a desired working frequency band. Therefore, the output of the millimeter wave power amplifier circuit 1 of the present invention can meet (or be applied to) different millimeter wave systems. Accordingly, the usage of the circuit can be elastically adjusted to achieve multi-frequency band adjustable effect. Also, the circuit design is simplified.

Therefore, the millimeter wave power amplifier circuit 1 of the present invention can achieve multi-frequency band adjustable effect to lower the cost. Also, the circuit can be designed more elastically.

Figure 5:
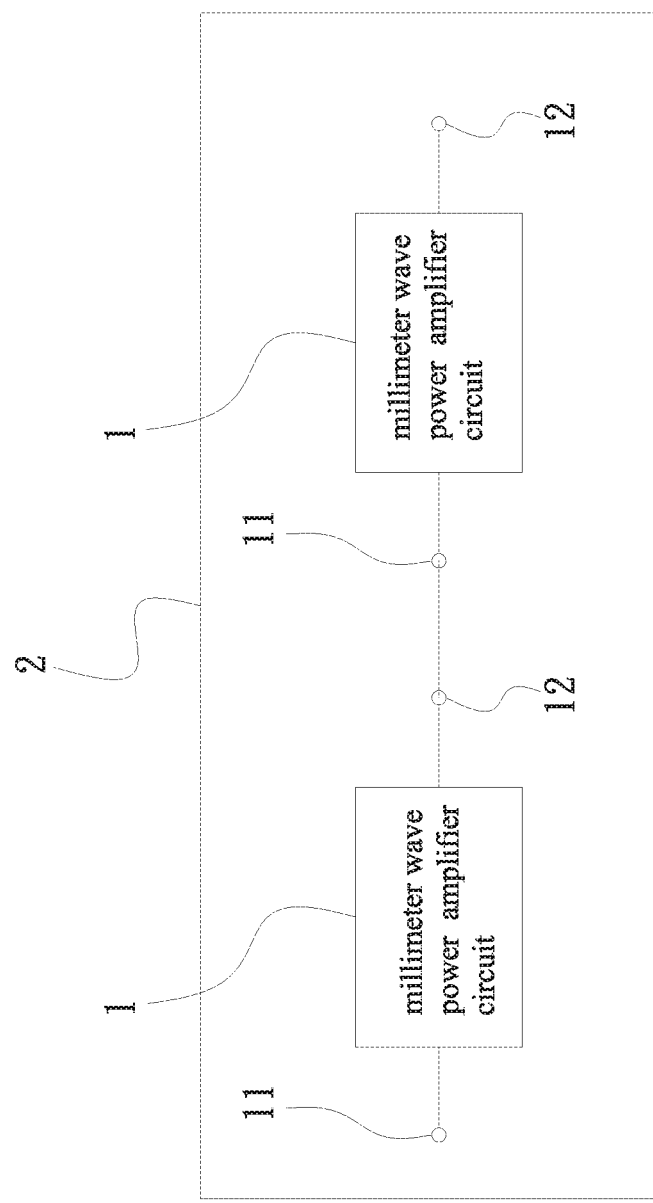
FIG. 5 is a block diagram of a second embodiment of the present invention.
Figure 6:
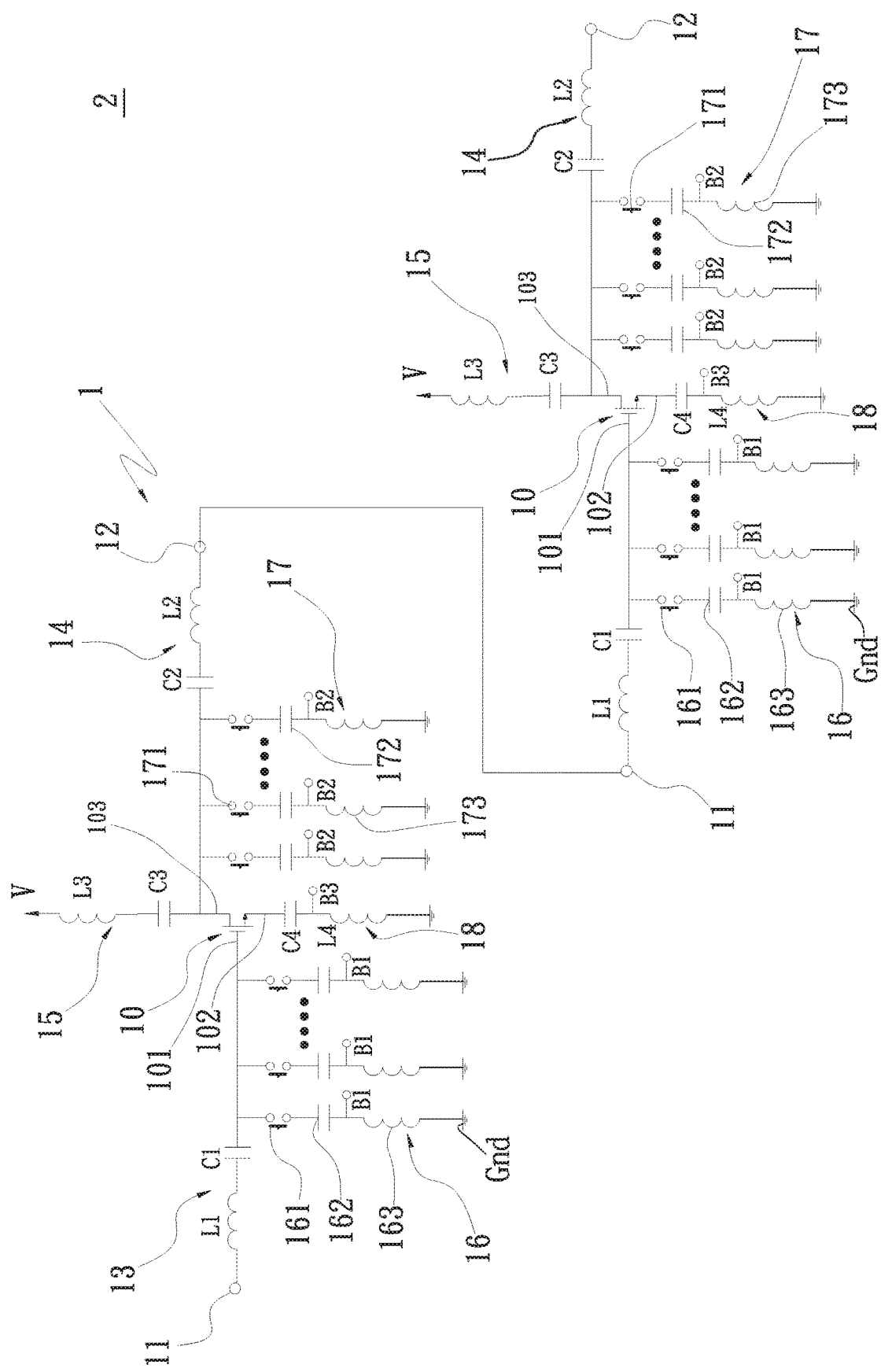
FIG. 6 is a circuit diagram of the second embodiment of the present invention.

Please now refer to FIGS. 5 and 6. FIG. 5 is a block diagram of a second embodiment of the present invention. FIG. 6 is a circuit diagram of the second embodiment of the present invention. Also referring to FIG. 2, the second embodiment of the millimeter wave power amplifier circuit 1 of the present invention is identical to the first embodiment of the millimeter wave power amplifier circuit 1 of the present invention in structure, connection relationship and effect and thus will not be redundantly described hereinafter.

In the second embodiment, there are multiple millimeter wave power amplifier circuits 1, which are serially connected to form a millimeter wave power amplifier device 2. That is, the millimeter wave power amplifier device 2 includes multiple millimeter wave power amplifier circuits 1. The multiple millimeter wave power amplifier circuits 2 have an input end 11 and an output end 12. In this embodiment, there are such as two multiple millimeter wave power amplifier circuits 1 serially connected with each other. That is, the output end 12 of the front millimeter wave power amplifier circuit 1 (such as the first millimeter wave power amplifier circuit 1) in each two adjacent millimeter wave power amplifier circuits 1 is connected with the input end 11 of the rear millimeter wave power amplifier circuit 1 (such as the second millimeter wave power amplifier circuit 1) in each two adjacent millimeter wave power amplifier circuits 1. In addition, the input end 11 of the foremost millimeter wave power amplifier circuit 1 (such as the first millimeter wave power amplifier circuit 1) serves to receive the radio-frequency signal transmitted from a processor (such as CPU, MCU or DSP) or single chip (such as radio-frequency chip or RF) in a millimeter wave system. The rearmost millimeter wave power amplifier circuit 1 (such as the second millimeter wave power amplifier circuit 1) serves to output the amplified radio-frequency signal.

In this embodiment, the number of the millimeter wave power amplifier circuits 1 in the millimeter wave power amplifier device 2 is not limited to two. In practice, the number of the sets of millimeter wave power amplifier circuits 1 in the millimeter wave power amplifier device 2 can be adjusted according to the design of the necessary multi-frequency band and enlarged frequency band range (such as 3 GHz-300 GHz) (into such as more than two millimeter wave power amplifier circuits 1). For example, one millimeter wave power amplifier circuit 1 is deemed as one set of millimeter wave power amplifier circuit 1 and one set of millimeter wave power amplifier circuit 1 has five frequency bands to be adjusted. In case a user needs fifteen frequency bands in the millimeter wave power amplifier device 2 to be adjusted, the user only needs to serially connect three sets of one set of millimeter wave power amplifier circuits 1. Multiple sets of first and second switch members 161, 171 in the multiple sets of millimeter wave power amplifier circuits 1 in the millimeter wave power amplifier device 2 cooperate with each other to achieve multi-frequency band adjustable effect. Also, the usage of the circuit can be elastically adjusted and the design of the circuit can be simplified.

Therefore, the millimeter wave power amplifier device 2 of the present invention can achieve multi-frequency band adjustable effect to lower the cost. Also, the circuit can be designed more elastically.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A millimeter wave power amplifier circuit comprising:
a transistor having a first end, a second end and a third end, the first end being connected with an input end, the second end being connected with a grounding end, the third end being respectively connected with an input power supply and an output end;
a first serial connection resonation unit connected between the first end and the input end;
a second serial connection resonation unit connected between the third end and the output end;
multiple first frequency band adjustment units having a first switch member, a first storage member and a second storage member, one end of the first switch member being connected with the first end, the other end of the first switch member being serially connected with the first and second storage members, the second storage member being connected with the grounding end; and
multiple second frequency band adjustment units having a second switch member, a third storage member and a fourth storage member, one end of the second switch member being connected with the third end, the other end of the second switch member being serially connected with the third and fourth storage members, the fourth storage member being connected with the grounding end.

2. The millimeter wave power amplifier circuit as claimed in claim 1, wherein the first end of the transistor is a gate, the second end of the transistor is a source and the third end of the transistor is a drain, the first serial connection resonation unit having a first inductor and a first capacitor, two ends of the first inductor being respectively connected with the input end and one end of the first capacitor, the other end of the first capacitor being connected with the gate.

3. The millimeter wave power amplifier circuit as claimed in claim 2, wherein the second serial connection resonation unit has a second inductor and a second capacitor, two ends of the second inductor being respectively connected with the output end and one end of the second capacitor, the other end of the second capacitor being connected with the drain.

4. The millimeter wave power amplifier circuit as claimed in claim 3, further comprising a third serial connection resonation unit, the third serial connection resonation unit being connected between the third end and the input power supply, the third serial connection resonation unit having a third inductor and a third capacitor, two ends of the third inductor being respectively connected with the input power supply and one end of the third capacitor, the other end of the third capacitor being connected with the drain and the other end of the second capacitor.

5. The millimeter wave power amplifier circuit as claimed in claim 4, further comprising a fourth serial connection resonation unit, the fourth serial connection resonation unit being connected between the second end and the grounding end, the fourth serial connection resonation unit having a fourth inductor and a fourth capacitor, two ends of the fourth inductor being respectively connected with the source and one end of the fourth inductor, the other end of the fourth inductor being connected with the grounding end.

6. The millimeter wave power amplifier circuit as claimed in claim 1, wherein two ends of the first storage member are respectively connected with the other end of the first switch member and one end of the second storage member, the other end of the second storage member being connected with the grounding end, a first input bias being connected between the first storage member and the second storage member.

7. The millimeter wave power amplifier circuit as claimed in claim 1, wherein two ends of the third storage member are respectively connected with the other end of the second switch member and one end of the fourth storage member, the other end of the fourth storage member being connected with the grounding end, a second input bias being connected between the third storage member and the fourth storage member.

8. The millimeter wave power amplifier circuit as claimed in claim 1, wherein the first storage member is a capacitor or an inductor and the second storage member is an inductor or a capacitor, the first switch member being a pushbutton switch, a finger-shifted switch or a touch switch.

9. The millimeter wave power amplifier circuit as claimed in claim 1, wherein the third storage member is a capacitor or an inductor and the fourth storage member is an inductor or a capacitor, the second switch member being a pushbutton switch, a finger-shifted switch or a touch switch.

10. The millimeter wave power amplifier circuit as claimed in claim 1, wherein the transistor is selected from a group consisting of complementary metal-oxide-semiconductor (CMOS), SiGe transistor, GaAs transistor, field-effect transistor (FET), GaN transistor and bipolar junction transistor (BJT).

11. A millimeter wave power amplifier device comprising multiple millimeter wave power amplifier circuits, the multiple millimeter wave power amplifier circuits having an input end and an output end, the output end of a front millimeter wave power amplifier circuit in each two adjacent millimeter wave power amplifier circuits being connected with the input end of a rear millimeter wave power amplifier circuit in each two adjacent millimeter wave power amplifier circuits, each millimeter wave power amplifier circuit including:
    a transistor having a first end, a second end and a third end, the first end being connected with an input end, the second end being connected with a grounding end, the third end being respectively connected with the output end and an input power supply;
    a first serial connection resonation unit connected between the first end and the input end;
    a second serial connection resonation unit connected between the third end and the output end;
    multiple first frequency band adjustment units having a first switch member, a first storage member and a second storage member, one end of the first switch member being connected with the first end, the other end of the first switch member being serially connected with the first and second storage members, the second storage member being connected with the grounding end; and
    multiple second frequency band adjustment units having a second switch member, a third storage member and a fourth storage member, one end of the second switch member being connected with the third end, the other end of the second switch member being serially connected with the third and fourth storage members, the fourth storage member being connected with the grounding end.

12. The millimeter wave power amplifier device as claimed in claim 11, wherein the first end of the transistor is a gate, the second end of the transistor is a source and the third end of the transistor is a drain, the first serial connection resonation unit having a first inductor and a first capacitor, two ends of the first inductor being respectively connected with the input end and one end of the first capacitor, the other end of the first capacitor being connected with the gate.

13. The millimeter wave power amplifier device as claimed in claim 12, wherein the second serial connection resonation unit has a second inductor and a second capacitor, two ends of the second inductor being respectively connected with the output end and one end of the second capacitor, the other end of the second capacitor being connected with the drain.

14. The millimeter wave power amplifier device as claimed in claim 13, further comprising a third serial connection resonation unit, the third serial connection resonation unit being connected between the third end and the input power supply, the third serial connection resonation unit having a third inductor and a third capacitor, two ends of the third inductor being respectively connected with the input power supply and one end of the third capacitor, the other end of the third capacitor being connected with the drain and the other end of the second capacitor.

15. The millimeter wave power amplifier device as claimed in claim 14, further comprising a fourth serial connection resonation unit, the fourth serial connection resonation unit being connected between the second end and the grounding end, the fourth serial connection resonation unit having a fourth inductor and a fourth capacitor, two ends of the fourth inductor being respectively connected with the source and one end of the fourth inductor, the other end of the fourth inductor being connected with the grounding end.

16. The millimeter wave power amplifier device as claimed in claim 11, wherein two ends of the first storage member are respectively connected with the other end of the first switch member and one end of the second storage member, the other end of the second storage member being connected with the grounding end, a first input bias being connected between the first storage member and the second storage member.

17. The millimeter wave power amplifier device as claimed in claim 11, wherein two ends of the third storage member are respectively connected with the other end of the second switch member and one end of the fourth storage member, the other end of the fourth storage member being connected with the grounding end, a second input bias being connected between the third storage member and the fourth storage member.

18. The millimeter wave power amplifier device as claimed in claim 11, wherein the first storage member is a capacitor or an inductor and the second storage member is an inductor or a capacitor, the first switch member being a pushbutton switch, a finger-shifted switch or a touch switch.

19. The millimeter wave power amplifier device as claimed in claim 11, wherein the third storage member is a capacitor or an inductor and the fourth storage member is an inductor or a capacitor, the second switch member being a pushbutton switch, a finger-shifted switch or a touch switch.

20. The millimeter wave power amplifier device as claimed in claim 11, wherein the transistor is selected from a group consisting of complementary metal-oxide-semiconductor (CMOS), SiGe transistor, GaAs transistor, field-effect transistor (FET), GaN transistor and bipolar junction transistor (BJT).

* * * * *